United States Patent [19]

Leenders et al.

[11] Patent Number: 4,701,401

[45] Date of Patent: Oct. 20, 1987

[54] PROCESS FOR THE FORMATION OF A LINEWORK OR HALFTONE MULTICOLOR COLLOID PATTERN

[75] Inventors: Luc H. Leenders, Herentals; Charles L. Ramon, Mortsel; Edie R. Daems, Herentals, all of Belgium

[73] Assignee: AGFA-Gevaert N.V., Mortsel, Belgium

[21] Appl. No.: 802,679

[22] Filed: Nov. 29, 1985

[30] Foreign Application Priority Data

Dec. 4, 1984 [EP] European Pat. Off. ........ 84201798.0

[51] Int. Cl.[4] ............................ G03C 1/90; G03C 7/22
[52] U.S. Cl. ..................................... 430/257; 430/494; 430/952
[58] Field of Search ................. 430/257, 258, 30, 494, 430/264, 293, 952

[56] References Cited

U.S. PATENT DOCUMENTS 3,642,474 2/1972 Verelst et al. ....................... 430/257
4,427,757 1/1984 Beebe et al. ......................... 430/264
4,596,757 6/1986 Barton et al. ....................... 430/257

FOREIGN PATENT DOCUMENTS 2220812 4/1974 France .
554298 6/1943 United Kingdom .
2130397 6/1983 United Kingdom .

OTHER PUBLICATIONS

*Colour Photography in Practice* by D. A. Spencer, Focal Press, London, pp. 264–279.
*Science et Industries Photographiques*, Time XX–1949, p. 470.

*Primary Examiner*—Richard L. Schilling
*Attorney, Agent, or Firm*—William J. Daniel

[57] ABSTRACT

Process for forming a halftone or multicolor colloid pattern by the following steps in sequence:
(1) scanningwise exposing to light a multicolor original carried, e.g., by a rotating scanner drum, to obtain separate red light, green light and blue light, out signals which are received by corresponding photonconductors to produce corresponding separate series of electrical signals, which are, e.g., fed into a computer,
(2) exposing in accordance with the respective series of signals a respective one of a plurality of differently colored hardening developable photographic materials corresponding in number to the number of said series, each such material comprising on a temporary support a silver halide emulsion containing colloid layer and at least one distinctively colored colloid layer,
(3) transferring the exposed hydrophilic colored colloid layers of one of said photographic materials from its temporary support onto a permanent support,
(4) hardening developing the transferred colloid layers to selectively harden the image regions thereof, and removing the unhardened regions thereof, and
(5) repeating steps (3) and (4) with the other exposed photographic materials to thereby produce a composite relief image of the differently colored hardened image regions on said permanent support. Alternatively, one of the exposed photographic materials can include a permanent support for the colloid layers thereon onto which the colloid layers of the exposed photographic materials with temporary supports are transferred and processed.

11 Claims, No Drawings

PROCESS FOR THE FORMATION OF A LINEWORK OR HALFTONE MULTICOLOR COLLOID PATTERN

DESCRIPTION

The present invention relates to an improved process for the formation of linework or halftone multicolour colloid patterns.

The production of linework or halftone multicolour colloid patterns is of interest in the field of design, e.g. in the production of colour decorative patterns, colour wiring and circuit diagrams, cartography, colour proofing and the preparation of transparencies for projection, optionally opaque prints for overhead projection.

Especially in the colour field of the graphic art there is a great need for a simple and fast technique offering "colour proofs" of high quality and reproducibility.

Photographically produced colour proofs are a substitute for multicolour halftone reproductions as will be produced by successive printing in register with the separate standard inks: magenta, yellow, cyan and black on a conventional printing press. The production of colour proofs by preparing a printing plate and actually running the plate on the press to produce only a few copies as proof of the quality of the halftone separation transparencies used in the exposure is a very expensive procedure and therefore photographic processes have been developed to obtain a similar result by means of which the appearance of a print starting from particular colour separation negatives or positives can be judged by the printer and client.

According to a process known from U.S. Pat. No. 3,642,474 the production of such a proof in the form of superposed coloured colloid patterns, proceeds with hydrophilic coloured colloid layers, which are hardened in the irradiated portions by means of an active species formed during or after the informationwise exposure to active electromagnetic radiation of a photosensitive substance, and comprises the following steps:

(1) transferring onto a permanent support from a relatively more hydrophobic temporary support a coloured hydrophilic colloid layer containing a said photosensitive substance and a hydrophilic colloid, which undergoes a reduction in solubility in water by said active species, by pressing the latter in the presence of an aqueous liquid against the colloid layer, and removing the temporary support, thus leaving the layer on the permanent support;

(2) exposing the transferred colloid layer in substantially dry state to active electromagnetic radiation, which is modulated according to the information to be recorded, (3) developing the exposed layer by means of an aqueous liquid followed by a wash-off processing resulting in a coloured relief pattern, and repeating the steps (1), (2) and (3) with said hydrophilic colloid layers having a colour as desired to produce superposed coloured colloid patterns on the permanent support.

In this process for producing a multicolour pattern the exposures proceed in register on the same permanent support which received the unexposed coloured hardenable colloid layers by transfer from a temporary support, each transfer and exposure being followed by hardening development, wash-off processing and a drying step before a next transfer and exposure leading to a further selection colour pattern can be carried out.

In the above process for the production of colour proofs the imagewise exposure proceeds in a vacuum frame with the particular separation negative of the multicolour pattern to be reproduced in contact with the coloured colloid layer on the permanent support.

In the graphic art field an increasing proportion of colour work is now made on colour scanners.

Colour scanners operate with a rotating scanner drum and in many instances with a laser light source of a definite narrow spectral composition. Therefore, scanningwise exposure requires photographic materials with a specific photosensitivity and in order to have a more economic application requires a sequence of exposure and processing steps such that the scanner can operate without interruptions caused by processing.

According to the basic principles of a reprographic scanner a light spot from a non modulated light source inside or outside a rotating drum is used to expose in transmission or reflection an original attached to the drum. The light beam of the spot modulated by the original is picked up by three photocells after passing through red, green and blue filters respectively. The amounts of red, green and blue light, and the resulting photocell responses, represent the colour of the original at this point. A computer operates on these signals to calculate the light output of the light source, e.g. argon laser light source, for the exposure of the proper photographic film in the production of the cyan, magenta, yellow and black colour selection. Scanning-exposure is inherently time consuming, e.g. takes up to about 10 minutes for a single DIN A4 size selection being scanned at 140 lines per cm.

The preparation of overlay colour proofs by scanningwise exposure on separate supports starting from non transferable pigmented silver halide gelatin coatings is described in U.S. Pat. No. 4,427,757 but yields inferior results because of poor whites due to the inherent absorption of the plurality of overlaying supports and the disturbing light-reflection obtained on each interlaying support.

The above sequence of processing steps as defined in U.S. Pat. No. 3,642,474 is not practical and is time consuming when for the imagewise exposures a scanner is used. Indeed, the above process is less suited to be combined with scanner exposure from the viewpoint of convenience and rapid access to the final multicolour reproduction because the scanner is not full time occupied since each scanning operation is interrupted by a wet hardening development, a wash-off processing and drying of a freshly transferred coloured colloid layer.

Since a scanner operates with fairly poor light-output and with limited spectral composition when a laser light source is used, it is not possible to operate with poorly photosensitive photographic materials such as those based on the UV-sensitive iron(III) complexes described in the already mentioned U.S. Pat. No. 3,642,474.

It is an object of the present invention to provide a process for the formation of a linework or halftone multicolour colloid pattern wherein the exposure of imagewise hardenable coloured hydrophilic colloid layers proceeds by scanningwise exposure without interruption by processing steps.

It is a further object of the present invention to provide a process wherein hardenable coloured hydrophilic colloid layers containing photosensitive silver halide, after their imagewise exposure with a scanner light source, are transferred one by one in registration from a temporary support onto a common permanent support whereon they immediately following each transfer are hardening developed and wash-off processed to yield on said permanent support an array of superposed monochrome colloid relief images forming a multicolour pattern serving as a colour proof.

It is another object of the present invention to provide a process wherein the colloid layers after imagewise exposure of photosensitive silver halide therein are hardening developed and wash-off processed on the temporary support and the colloid relief images are transferred in register from the temporary support to a same permanent support whereon they yield superposed monochrome colloid relief images forming a multicolour pattern serving as a colour proof.

Other objects and advantages of the present invention will become clear from the further description.

In accordance with the present invention the process for forming a linework or halftone multicolour colloid pattern comprises in the sequence given the following steps:

(1) the scanningwise exposure of a multicolour original attached to a rotating scanner drum to obtain separate red light, green light and blue light output signals received by photon-detectors to produce corresponding electrical signals, which are fed into a computer, (2) the computer controlled exposure, of differently coloured hardening developable photographic materials each comprising on a temporary support one or more hardenable hydrophilic colloid layers at least one of which contains dispersed photosensitive silver halide, (3) transferring integrally said hydrophilic colloid layer(s) of a first of said exposed photographic materials onto a permanent support, that at its surface is less hydrophobic than the temporary support, by pressing the permanent support in the presence of an aqueous liquid against the hydrophilic colloid layer side of said photographic material and removing the temporary support, thus leaving said hydrophilic colloid layer(s) on the permanent support, (4) developing the transferred exposed photosensitive silver halide with a hardening developing agent to form imagewise hardened coloured hydrophilic colloid portions and removing the non-hardened colloid portions to leave a coloured relief image on the permanent support, and (5) producing a multicolour pattern on said same permanent support by repeating the steps (3) and (4) with at least one other scanningwise exposed differently coloured photographic material, the transfer procedure of step (3) being effected on the same permanent support with the images in registration.

Optionally, a bleachfix treatment is applied to remove developed silver from the obtained relief images and to obtain more bright and colour-pure images.

In a preferred scanningwise exposure called "a single scan operation" the exposure of all the differently coloured hardening developable photographic materials comprising on a temporary support a silver halide emulsion layer proceeds on the same scanner drum by arranging the materials on the drum in adjacent order and effecting the scanning without interrupting the rotation of the drum.

A very good image sharpness is obtained by effecting the removal of the non-hardened colloid portions in step (4) by wash-off processing. Another way to remove these portions is by transferring them by adherence to a receiving sheet.

In the present process the best results from the viewpoint of image-sharpness are obtained by effecting the scanningwise exposure of the light-sensitive silver halide from the front side, so not through the transparent temporary support. Such requires, however, a reverse reading exposure to obtain after transfer right reading copies. In modern scanner exposure apparatus such does not form a problem since the computer software allows electronic image-reversing without special optics such as mirrors and the like.

According to a particular embodiment the present process is carried out with a photographic material comprising a temporary support which is a nonsubbed hydrophobic resin film support and, a silver halide emulsion layer incorporating in a substantially nonhardened gelatin binder a silver halide hardening (tanning) developing agent, photosensitive silver halide grains and pigments providing the desired colour.

According to a special embodiment a coloured layer containing photosensitive silver halide is combined with an underlying additional layer containing an auxiliary developing agent forming a superadditive developing system with the hardening developing agent on the temporary support.

According to another embodiment the silver halide emulsion layer is non-coloured but is applied onto a hardenable coloured hydrophilic colloid layer wherein during processing oxidized tanning developing agent can diffuse to effect therein an imagewise hardening reaction congruent with the reaction taking place in the emulsion layer. Photographic silver halide emulsion materials containing such adjacent pigmented hydrophilic colloid layer are described, e.g. in GB-P No. 1,072,862 and corresponding U.S. Pat. No. 3,364,024.

The hydrophilic colloid of the hardenable layers used according to the present invention is preferably substantially unhardened gelatin as described in U.S. Pat. No. 3,364,024.

In the production of superposed multicolour colloid patterns coloured substances used in the hardenable colloid layers have to be resistant to diffusion and chemically inert in the processing and washing liquid(s) as much as possible. When being used in colour proofing they have to match with the absorption spectrum of the standard process inks as close as possible. Information about standard colour inks can be found in H. M. Cartwright—Ilford Graphic Arts Manual (1962) VoL. I—pages 502 to 504.

There exist "cold" and "warm" colour standards. Cold colour tones are, e.g. standardized in the U.S.A. in the GATF-Colour Charts and in the German Standards DIN 16508 and 16509. Warm colour tones are standardized, e.g. in the German Standard DIN 16538.

The cold colour tones are obtained e.g. by the use of substantially pure magenta dyes, mostly insolubilized rhodamine and phloxine-dyes, which have a very low side absorption in the blue region of the spectrum.

The warm colour tones are obtained e.g. by the use of insolubilized azo dyestuffs. These dyestuffs are more resistant to solvents, e.g. alcohol, than the rhodamines and phloxines, but they possess a much higher side absorption in the blue region of the spectrum.

It has been found experimentally that pigments, which are insoluble or very poorly soluble in water and in organic liquids of the alcohol or polyhydric alcohol type, e.g. glycerol, fulfil the requirements of resistance to diffusion. Dyes in pigment form that are applied from an aqueous dispersion are used preferably, though the use of substantive dyes, i.e. chemically reactive dyes, that are chemically linked to the hardenable colloid is not excluded. For colour proofing purposes the hardenable colloid layer should preferably contain coloured substances in a concentration sufficiently high for obtaining an optical density of at least 0.35 in the wavelength range of maximum absorption.

The coloured substances may have all kind of colour, e.g. are cyan, light-cyan, magenta, warm magenta, black, yellow, green, brown, orange, red, white or blue. Considered are likewise metallic colours such as pale gold, rich gold, copper, and silver. In other words the term "colour" in the present invention encompasses the use of all pure and mixed colours as well as black and white.

Pigments particularly suitable for use in the present invention are known organic non-migratory dyes, e.g. obtainable under the Trade Marks "PIGMOSOL" and "COLANYL" dyes. "PIGMOSOL" and "COLANYL" are organic pigments that are mixed with a dispersing agent for an aqueous medium. These pigments excel in resistance to light, heat, acids, bases, oxidizing agents, and solvents. They are insoluble in hydrophilic colloids such as gelatin.

When in addition to cyan, magenta and yellow relief patterns a black relief pattern is formed in colour proofing, preferably carbon black is used. Apart from carbon black mixtures of coloured pigments may be applied as described e.g. in U.S. Pat. No. 4,427,757.

According to a special embodiment in order to avoid a direct contact of the coloured substances with the permanent support the coloured hydrophilic colloid layer on the temporary support is over-coated with a hydrophilic colloid layer (top layer), which is not coloured, i.e. does not contain pigments or dyes for forming the image. On transfer of such composite coating the top layer comes into contact with the permanent support and is sandwiched between said support and the coloured coating. The top layer may contain the same colloid(s) as the coloured layer. The top layer, however, may contain a small amount of translucent pigments, e.g. silica particles, protruding from the layer and being a few microns thicker than the top layer. The avoid sticking, i.e., blocking of rolled up sheet material at relatively high (e.g. 60%) relative humidity. The top layer contains, e.g., 0.2 to 1.5 g of gelatin per sq.m.

In order to obtain images with a good resolution, relatively thin radiation-sensitive coloured colloid coatings are preferred. Preferably they have a thickness in the range of 1 μm and 15 μm. Good results are obtained with coloured colloid layers containing 1 to 10 g of gelatin per sq.m. Very good results are obtained with colloid layers having a combined thickness of 1 to 5 μm and containing 0.5 to 3 g of gelatin per sq.m. The colloid layers preferably contain at least 50% by weight of gelatin.

The adhering power of each transferable layer or composite layer to its temporary support, preferably a flexible one, should be such that an easy stripping off from the temporary support is possible after pressing the layer into contact with the permanent support. Therefore, a relatively hydrophobic temporary support e.g. an unsubbed cellulose triacetate sheet, a polystyrene sheet, a polyester sheet, or sheet of copoly(vinyl acetate/vinylchloride) and a permanent support having a hydrophilic surface, e.g. a polyethylene terephthalate support subbed for adhering gelatin coatings is used, preferably e.g. a hydrophibic support subbed as described in the United Kingdom Patent Specification No. 1,234,755. Other temporary supports having a repelling power for wet gelatin coatings are, e.g. a paper base coated with a polyethylene layer, a paper base impregnated with wax, a paper base coated with a layer of cellulose nitrate or a paper base coated with a layer of insolubilized polyvinyl alcohol or a layer of alginic acid insolubilized with an alkaline earth metal salt.

According to an embodiment the coloured hydrophilic colloid layer or composite layer is composed in such a way that its adherence to the temporary support in wet state is less than in dry state. This can be attained by the addition of hygroscopic agents, e.g. a water-soluble organic hygroscopic compound e.g. glycerol, and the use of wetting and plasticizing agents.

The permanent support may be rigid or flexible and only must present by itself or by means of (a) subbing layer(s) a good adherence in wet as well as in dry state for the transferable hydrophiblic colloid coating.

Depending on the use of the multicolour print the permanent support is transparent, translucent or opaque. So, it is possible to use metal layers or sheets, glass, ceramics, resin supports and paper, e.g. glassine paper, impermeabilized for the processing and washing liquids.

For purposes such as colour proofing wherein three or more transfers have to be effected in register it is necessary to use a resin support with high dimensional stability.

Resin supports characterized by a high mechanical strength and very low water absorption and consequently high dimensional stability in dry and wet state can be formed from a linear polyester, e.g. polyethylene terephthalate.

Good results as to dimensional stability are obtained with aluminium sheets sandwiched between two high wetstrength paper sheets although this material is rather expensive.

Permanent resin supports can be made opaque by coating them with a matted subbing layer or by matting or colouring them in the mass. The matting may be effected by pigments known therefor in the art, e.g. titanium dioxide, zinc oxide, and barium sulphate. Matting can also be obtained by producing a "blushcoat" as described e.g. in United Kingdom Patent Specification No. 943,681.

The photosensitive silver halide used in the present invention may comprise silver chloride, silver bromide, silver bromoiodide, silver chlorobromoiodide and the like, or mixtures thereof. The silver halide emulsions may be coarse or fine grain and can be prepared by any of the well known procedures, e.g., single jet emulsions, double jet emulsions, such as Lippmann emulsions, ammoniacal emulsions, thiocyanate- or thioether-ripened emulsions such as those described in U.S. Pat. Nos. 2,222,264 of Adolph H. Nietz and Frederick J. Russell, issued Nov. 19, 1940, 3,320,069 of Bernard D. Illingsworth, issued May 16, 1967, and 3,271,157 of Clarence E. McBride, issued. Sept. 6, 1966. Surface image emulsions may be used or internal image emulsions may be used such as those described in U.S. Pat. Nos. 2,592,250 of Edward Philip Davey and Edward Bowes Knott, issued Apr. 8, 1952, 3,206,313 of Henry D. Porter, Thomas H. James and Wesley G. Lowe, issued Sept. 14, 1965, and 3,447,927 of Robert E. Bacon and Jean F.

Barbier, issued June 3, 1969. The emulsions may be regular-grain emulsions such as the type described by Klein and Moisar in J. Photogr. Sci., Vol. 12, No. 5, September/October 1964, pp. 242-251. If desired, mixtures of surface and internal image emulsions may be used as described in U.S. Pat. No. 2,996,382 of George W. Luckey and John C. Hoppe, issued Aug. 15, 1961.

Apart from negative working silver halide emulsions that are preferred for their high light sensitivity, direct positive silver halide emulsions may be used that produce a positive silver image and a corresponding imagewise distribution of developing agent oxidation products during their development. For example those direct positive silver halide emulsions are considered whereby by exposure or by a chemical treatment a developable fog has been produced, which is destroyed imagewise during the imagewise exposure when certain conditions are fulfilled. In the unexposed areas the fog is maintained so that during the subsequent development a direct positive silver image is obtained and in correspondence therewith an imagewise distribution of oxidized hardening developing agent.

For example, direct positive emulsions of the type described in P. J. Hillson, U.S. Pat. No. 3,062,651, may be utilized to obtain direct positive images. In emulsions of this type, a nonhardening fogging agent such as stannous chloride, formamidine sulfinic acid, or the like is used.

More details about composition, preparation and coating of silver halide emulsions are described, e.g., in Product Licensing Index, Vol. 92, December 1971, publication 9232, p. 107-109 and Research Disclosure, of December 1978, publication 17643.

The silver halide emulsions can be chemically sensitized, e.g. by adding sulphur-containing compounds, e.g. allyl isothiocyanate, allyl thiourea, sodium thiosulphate and the like, during the chemical ripening stage. Also reducing agents, e.g. the tin compounds described in the Belgian Patent Specifications Nos. 493,464 and 568,687, and polyamines such as diethylenetriamine or derivatives of aminomethane-sulphonic acid, e.g. according to the Belgian Patent Specification No. 547,323, can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65-72 (1951).

Further it is possible to sensitize the emulsions with polyalkylene oxide derivatives, e.g. with polyethylene oxide having a molecular weight between 1000 and 20,000, or with condensation products of alkylene oxides and aliphatic alcohols, glycols, cyclic dehydration products of hexitols, alkyl substituted phenols, aliphatic carboxylic acids, aliphatic amines, aliphatic diamines and amides. The condensation products have a molecular weight of at least 700, preferably of more than 1000. For obtaining special effects these sensitizers of course can be combined with each other as described in Belgian Patent Specification No. 537,278 and UK Patent Specification No. 727,982.

The spectral photosensitivity of the silver halide has to be compatible with the spectral composition of the scanning exposing light and for a proper spectral sensitization the usual mono- or polymethine dyes such as acidic or basic cyanines, hemicyanines, oxonols, hemioxonols, styryl dyes or others, also tri- or polynuclear methine dyes, e.g. rhodacyanines or neocyanines may be used. Such spectral sensitizers are described, e.g., by F. M. HAMER in "The Cyanine Dyes and Related Compounds" (1964) Interscience Publishers, John Wiley & Sons, New York.

The silver halide emulsions may contain the usual stabilizers, e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxyl or amino groups. Compounds of this kind are described by BIRR in Z. Wiss. Photogr. Photophys. Photochem. 47, 2-27 (1952). Still other suitable stabilizers are amongst others heterocyclic mercapto compounds, e.g. phenylmercaptotetrazole, quaternary benzothiazole derivatives, benzotriazole and the like.

The hardening development proceeds with commonly used hardening developing agents, also called tanning developing agents for effecting the development of the silver halide and producing oxidized developing agent acting as hardening agent for the hydrophilic colloid binder such as gelatin. Examples of suitable hardening developing agents are: 1,4-dihydroxy benzene compounds such as hydroquinone, chlorohydroquinone, bromohydroquinone, toluhydroquinone, morpholinemethyl hydroquinone, sulfohydroquinone and the like.

The developing agent may be incorporated in the silver halide emulsion layer or in a nonsilver halide containing layer adjacent thereto so that development can be attained by using an alkaline activator liquid.

Typical activator baths for a hardening developable photographic silver halide emulsion material comprise, for example, an aqueous solution of an alkaline material, such as sodium carbonate, sodium hydroxide, potassium carbonate, potassium hydroxide, mixtures of sodium hydroxide and sodium sulfite, etc. A suitable activator bath comprises e.g. about 2 percent by weight of sodium hydroxide and 0.5 percent by weight of sodium sulfite.

It will be appreciated that an auxiliary developing agent can be used along with a hydroquinone developing agent in order to improve the speed without disadvantageously affecting the wash-off processing of the invention. Typical auxiliary developing agents include 3-pyrazolidinone developing agents, e.g. 1-phenyl-3-pyrazolidinone, 1-phenyl-4,4-dimethyl-3-pyrazolidinone, 1-phenyl-4-methyl-4'-hydroxymethyl-3-pyrazolidinone and N-methyl-p-aminophenol sulphate.

These auxiliary developing agents or a mixture thereof may be incorporated in the photographic material and/or in the developing liquid in which the hardening developing agent may be absent when using an alkaline activator bath.

A detailed description is hereinafter set forth of an exemplary composition and structure of a light-sensitive material and use in the production of a multicolour image according to an embodiment of the present invention.

A coating composition is prepared containing gelatin dissolved in water wherein the selected pigment is dispersed in a concentration to yield after coating and drying a layer having an optical density in the wavelength range of maximal absorption of at least 0.4. The coating composition preferably contains at least 50% by weight of gelatin in respect of the pigment particles and a proper amount of plasticizing agent and a water attracting compound, e.g. glycerol to give the coating a sufficient adherence to its termporary support and to enable its easy wet (aqueous) stripping off from the temporary support, e.g. an unsubbed cellulose triacetate or polyethylene terephthalate support. In addition to said ingredients the coating composition contains photosensitive silver halide grains and a hardening developing agent in an amount high enough to allow selective hardening of the gelatin.

The said coating preferably contains 1 to 10 g of gelatin per sq.m.

According to an alternative embodiment a composite layer structure is used wherein the above defined silver halide emulsion layer is present as a top layer free from pigments and said emulsion layer is coated on top of an underlying hardenable pigmented coating. The underlying coating preferably contains 0.2 to 2.5 g of gelatin per sq.m.

The top layer and underlying layer form firmly bound together a "composite layer" which can be transferred as a whole from the temporary support to the permanent support.

A set of materials each containing such a composite layer is preferably used for preparing a multicolour "colour proofing image". A usual set contains yellow, magenta, cyan, and black pigment coatings on separate cellulose triacetate supports.

The permanent support is e.g. a polyethylene terephthalate base that is successively coated with a first subbing layer on the basis of a copolymer containing hydrophobic and hydrophilic structural units in a suitable ratio and a second subbing layer, which is more hydrophilic than the first one and contains gelatin, a hydrophobic latex polymer and a white pigment, e.g. titanium dioxide particles, for conferring an opaque aspect to the support.

The preparation of a multicolour "colour proof" then proceeds according to a preferred embodiment as follows.

To the permanent support subbed as described above a scanningwise exposed cyan composite layer is transferred by pressing the surface of the subbing layer and of the exposed layer together in the presence of an aqueous liquid and peeling off the temporary cellulose triacetate support.

The transfer can be carried out in an apparatus, in which the materials involved are pressed together between rollers.

An apparatus particularly suitable for use in transferring in wet or moist state a hydrophilic colloid layer from a temporary support to a permanent support comprises a pair of cooperating pressure rollers and means for driving said rollers, a first platform for supporting the permanent support prior to its engagement by said pressure rollers, said platform in order to reduce frictional contact having a corrugated structure to make discontinuous contact with the permanent support when the latter is placed thereon, a second platform arranged over and separated from the first surface for supporting at least the leading part of the temporary support to keep the temporary support separated from a permanent support when this is located on the first platform, the forward ends of both platforms being disposed proximate to the nip of the pressure rollers so that the supports as they are advanced are gripped by rollers and progressively pressed together.

After the hardening development step the nonhardened portions of the composite layer are washed off without mechanical rubbing by means of running water at a temperature preferably between 30° and 50° C. Excess of liquid is preferably removed by squeezing the relief between two smooth soft rollers, e.g. rubber rollers.

In successive order the same steps are carried out for the yellow, magenta, and black pigmented composite layers which after their imagewise exposure are transferred in the dark from their temporary support in register onto the same permanent support carrying already the cyan pigment resist. However, the order wherein the colour relief images are arranged can be chosen arbitrarily.

The permanent support carrying the first relief image (the cyan relief image) is pressed between the same rollers while in contact with another scanningwise exposed coloured composite layer, e.g. the yellow one, and after a few seconds of contact the temporary support is peeled off, thus transferring the exposed yellow composite layer in entirety onto the cyan part relief image produced already.

In a particular case of four colour printing the cyan composite layer or other first monochrome layer is carried in unexposed state on the permanent support and after direct reading exposure thereon processed to form the first coloured relief image thereon.

The obtained multilayer colloid pattern can be protected by a transparent resin topcoat, which according to a preferred embodiment is applied by spraying. A suitable "spray-cover" consists of polyisobutyl methacrylate.

The production of a multicolour proof is illustrated in more detail in the following examples. The percentages are by weight if not otherwise indicated.

EXAMPLE 1

Preparation of photographic material with temporary support

On a temporary support of unsubbed cellulose triacetate having a thickness of 0.1 mm the following gelatin containing layers were applied in the order given:
(i) a pre-coat containing gelatin, glycerol and colloidal silica at a coverage of these ingredients respectively of 0.4 g per sq.m, 0.2 g per sq.m and 0.06 g per sq.m. The pH of the coating composition was 4.5.
(ii) a silver chlorobromide-iodide emulsion (molar ratio 83.6/16/0.4) containing diffusion-resistant cyan coloured pigment and having a silver halide coverage equivalent with 0.25 g of silver per sq.m. and gelatin coverage of 1.8 g per sq.m. The emulsion was spectrally sensitized for argon ion laser light. The cyan pigment was FLEXONYL BLUE Paste (C.I. Index Nr. 74,160) which was applied at 6.3 g per liter of coating composition corresponding with 0.126 g of pigment solid per sq.m. The pH of the coating composition was 5.0; and
(iii) a non pigmented gelatin binder layer containing per sq.m 0.7 g of gelatin, 0.066 g of hydroquinone and 0.095 g of matting agent on the basis of silica particles coated with urea formaldehyde resin.

Magenta, yellow and black pigment coatings were individually applied to separate unsubbed cellulose triacetate temporary supports for the cyan pigmented coating above. The magenta pigment was HELIOECHTCARMIN BB TEIG (Colour Index Nr. 12,485) and the yellow pigment was HELIOECHTGELB GRN 7476 Feinteig (Colour Index Nr. 21,100). Such pigments were used in an amount of 14.5 g and 17.6 g respectively per liter of coating composition. In the black pigment coating carbon black was used in admixture with the above mentioned FLEXONYL BLUE in an amount of 15.75 g and 1.26 g respectively per liter of coating composition.

Scanningwise exposure

The scanningwise exposure proceeded on a commercial scanner operating with an argon ion laser source emitting at 488 nm.

The four photographic materials containing the differently pigmented coatings, said materials having DIN A4 format, were adjacently arranged on the scanner drum, so that in a single step all the pigmented coatings were exposed without stopping the rotation of the drum.

The transfer

In the exposed state first the cyan pigment containing multilayer structure was transferred onto a permanent support of subbed polyethylene terephthalate as described in U.S. Pat. No. 3,642,474 by soaking the permanent support in water for 30 s and then pressing it into contact with the gelatin containing layer (iii). By stripping apart the temporary support the composite layer structure (i), (ii) and (iii) was left altering on the permanent support.

Hardening development

The transferred composite coating was hardening developed by dipping it for 30 s in an aqueous liquid, called activator bath, having following composition:

| | |
|---|---|
| potassium hydroxide | 25 g |
| potassium carbonate | 150 g |
| potassium bromide | 0.5 g |
| sodium sulphite | 2.0 g |
| 1-phenyl-3-pyrazolidinone | 4.0 g |
| mono sodium salt of ethylenediamine tetra-acetic acid | 1.0 g |

Thereupon the developed material containing a hardened latent cyan image was led through a bleach-fix bath containing sodium thiosulphate and the mono sodium, iron(III) salt of ethylenediamine tetra-acetic acid.

The wash-off processing

To obtain a cyan coloured relief image the hardening developed and bleach-fix processed material was wash-off processed with a warm (35° C.) water spray to remove the unhardened regions therefrom, leaving the hardened regions as a relief. The relief image was dried.

Transfer hardening development, bleach-fix processing and wash-off processing then proceeded one at a time for the other already exposed pigmented layers in the same way so as to transfer these layers one by one in registration onto an already previously formed (cyan) relief image on the same permanent support, hereby forming a multicolour proof.

EXAMPLE 2

A photographic material with temporary support was prepared as described in example 1, with the difference that 1-phenyl-4-methyl-3-pyrazolidinone was incorporated in the layer (i) at a coverage of 0.05 g per sq.m. Operating that way the auxiliary developing agent could be omitted from the activator bath.

We claim:
1. Process for forming a linework or halftone multicolour colloid pattern which comprises the following steps in sequence:
    (1) scanningwise exposing with light a multicolour original to obtain separate red light, green light and blue light output signals and receiving said separate signals by photon-detectors to produce corresponding separate series of electrical signals;
    (2) feeding said separate series of electrical signals to a computer and exposing under control of said computer according to the corresponding series of signals coloured hardening developable photographic materials comprising a temporary support carrying one or more hardenable hydrophilic colloid layers at least one of which is coloured distinctively from the layers of the other materials and at least one of which contains dispersed photosensitive silver halide, thereby forming in each such photographic material a latent image in accordance with the series of electrical signals corresponding to that material;
    (3) transferring all such hardenable hydrophilic colloid layers of one of said exposed photographic materials from the temporary support therefor onto a permanent support, that at its surface is less hydrophobic than the temporary support, by pressing the permanent support in the presence of an aqueous liquid against the hydrophilic colloid layer side of said photographic material and removing the temporary support, thus leaving such hydrophilic colloid layers intact on said permanent support;
    (4) developing the thus-transferred exposed photosensitive silver halide with a hardening developing agent to form in all such coloured hydrophilic colloid layers hardened images and unhardened background regions and removing the unhardened colloid portions to leave a coloured hardened colloid relief on the permanent support; and
    (5) repeating steps (3) and (4) with the other scanningwise exposed differently coloured photographic materials, the transfer procedure of step (3) being effected with the image regions of said transferred layers in registration, whereby a composite relief image in said different colors is produced on said permanent support.
2. Process according to claim 1, wherein in step (4) the removal of the unhardened colloid regions is effected by contacting the transferred and hardened developed colloid layers with a liquid medium dissolving selectively the unhardened regions thereof.
3. Process according to claim 1, wherein the light source for said scanningwise exposure of the light-sensitive silver halide is located on the side of each photographic material opposite said temporary support, said series of signals are stored in respective memories, and said signals are manipulated in said memories to produce a reverse reading exposure of said photographic material.
4. Process according to claim 1, wherein the photographic material comprises on a non-subbed hydrophobic polymer film support, a coloured silver halide emulsion layer incorporating in a substantially unhardened gelatin binder a silver halide tanning developing agent, photosensitive silver halide grains and pigment of the desired colour.

5. Process according to claim 1, wherein in each said photographic material said silver halde emulsion layer is not coloured but is applied onto a hardenable coloured hydrophilic colloid layer whereby during said developing step oxidized hardening developing agent can diffuse into said hardenable colloid layer to effect therein an imagewise hardening reaction congruent with the development reaction taking place in the emulsion layer.

6. Process according to claim 1, wherein the coloured layer on at least one of the temporary supports is overcoated with a hydrophilic colloid layer, that does not contain colorant for forming the image of that layer.

7. Process according to claim 1, wherein the hardenable colloid layers have a combined thickness in the range of 1 μm and 15 μm and contain 1 to 10 g of gelatin per sq.m.

8. Process according to claim 1, wherein the temporary support is an unsubbed cellulose triacetate sheet.

9. Process according to claim 1, wherein the permanent support is a subbed polyethylene terephthalate support carrying a subbing layer for improving its adherence to a colloid containing layer.

10. Process according to claim 1, wherein the scanningwise exposure proceeds in a single scan operation on all the differently coloured photographic materials.

11. Process for forming a linework or halftone multicolour colloid pattern which comprises the following steps in sequence:
  (1) scanningwise exposing a multicolour original to obtain separate red light, green light and blue light output signals and receiving said separate signals by photon-detectors to produce corresponding separate series of electrical signals;
  (2) feeding said separate series of electrical signals to a computer and exposing under control of said computer according to the corresponding series of signals coloured hardening developing photographic materials, one of which comprises a permanent support carrying one or more hardenable colloid layers and the others comprise a temporary support carrying one or more hardenable hydrophilic colloid layers, at least one of the colloid layers of each said material being colored distinctively from the layers of the other such materials and at least one of which contains dispersed photosensitive silver halide, thereby forming in each such photographic material a latent image in accordance with the series of electrical signals corresponding to that material;
  (3) developing the colloid layers on said permanent support with a hafdening developing agent to form therein hardened images and unhardened background regions and removing the unhardened colloid regions to leave a colored hardened colloid relief image on said permanent support;
  (4) transferring all such hardenable colloid layers of one of said exposed photographic materials including a temporary support from said temporary support onto the colloid layers carried on said permanent support, by pressing the external colloid layer on said permanent support in the presence of an aqueous liquid against the hydrophilic colloid layer side of said photographic material and removing the temporary support, thus leaving such hardenable hydrophilic colloid layers intact on said permanent support,
  (5) developing the exposed photosensitive silver halide in the thus-transferred colloid layers with a hardening developing agent to form in all such transferred coloured hydrophilic colloid layers hardened images and unhardened background regions and removing the unhardened colloid regions to leave a coloured hardened colloid relief on the permanent support; and
  (6) repeating the steps (4) and (5) with the other scanningwise exposed differently coloured photographic materials with temporary supports, the transfer procedure of step (4) being effected with the image regions of said transferred layers in registration, whereby a composite relief image in said different colors is produced on said permanent support.

* * * * *